(12) United States Patent
Kirn

(10) Patent No.: US 7,692,487 B2
(45) Date of Patent: Apr. 6, 2010

(54) LOW RF INTERFERENCE SWITCHING AMPLIFIER AND METHOD

(76) Inventor: Larry Kirn, 2106 Kenwood Ave., Austin, TX (US) 78704

(*) Notice: Subject to any disclaimer, the term of this patent is extended or adjusted under 35 U.S.C. 154(b) by 56 days.

(21) Appl. No.: 12/024,074

(22) Filed: Jan. 31, 2008

(65) Prior Publication Data

US 2008/0180172 A1 Jul. 31, 2008

Related U.S. Application Data

(60) Provisional application No. 60/887,394, filed on Jan. 31, 2007.

(51) Int. Cl.
*H03F 3/217* (2006.01)
(52) U.S. Cl. .................. 330/251; 330/10; 330/207 A
(58) Field of Classification Search ............ 330/10, 330/251, 207 A
See application file for complete search history.

(56) References Cited

U.S. PATENT DOCUMENTS

| | | | |
|---|---|---|---|
| 6,535,058 B1 | 3/2003 | Kirn | 330/10 |
| 6,937,090 B2 | 8/2005 | Kirn | 330/10 |
| 7,355,473 B2* | 4/2008 | Wu | 330/10 |
| 7,388,431 B2* | 6/2008 | Chang et al. | 330/251 |
| 2002/0060605 A1 | 5/2002 | Kowkutla et al. | 330/10 |
| 2004/0232979 A1 | 11/2004 | Edwards et al. | 330/10 |
| 2006/0125554 A1 | 6/2006 | Chen et al. | 330/10 |

* cited by examiner

*Primary Examiner*—Robert Pascal
*Assistant Examiner*—Hieu P Nguyen
(74) *Attorney, Agent, or Firm*—Dorsey & Whitney LLP

(57) ABSTRACT

A switching amplifier includes first and second output terminals that may be connected to a load. A pulse-width modulator receiving an input signal to obtain respective positive and negative values of the input signal. The modulator is connected to first and second switching circuits. The first switching circuit applies a plurality of pulses to the first output terminal that, in response to the positive samples, have a constant frequency and are pulse-width modulated, and, in response to the negative samples, have a varying frequency and a constant width. Similarly, the second switching circuit applies a plurality of pulses to the second output terminal that, in response to the negative samples, have a constant frequency and are pulse-width modulated, and, in response to the positive samples, have a varying frequency and a constant width. The varying phase of the constant width pulses disperses RF interference across a wider spectrum.

16 Claims, 3 Drawing Sheets

US 7,692,487 B2

LOW RF INTERFERENCE SWITCHING AMPLIFIER AND METHOD

CROSS-REFERENCE TO RELATED APPLICATION(S)

This application claims the benefit of U.S. Provisional Application No. 60/887,394, filed Jan. 31, 2007, now expired. The entire disclosure of the prior application is considered to be part of the disclosure of the instant application and is hereby incorporated by reference therein.

TECHNICAL FIELD

This invention relates to switching amplifiers and methods, and, more particularly, to a system and method for reducing the electromagnetic interference of switching amplifiers.

BACKGROUND OF THE INVENTION

Switching amplifiers provide far greater efficiency than their analog counterparts, primarily because transistors used to switch voltages to a load are either turned ON, so that the voltage across the transistor is relatively low, or turned OFF, so that the current through the transistor is relatively low. With either a low voltage across the transistor or a low current through the transistor, the power dissipated by the transistor is relatively low.

Although conventional switching amplifiers are widely used, they can produce excessive distortion in their output signals because of capacitive coupling between the gates of respective switching transistors used by such amplifiers. Another limitation of conventional switching amplifiers is that they can sometimes generate excessive electromagnetic radio frequency ("RF") interference, that can interfere with the operation of the amplifier as well as with other electronic devices in the vicinity of the amplifier. This RF interference can be attenuated to some extent by coupling the load driven by the amplifier to filters formed by inductors and/or capacitors. However, the remaining RF interference can still be too high in some applications.

Attempts have been made to minimize the distortion of signals output from switching amplifiers by operating them in a balanced manner so that capacitive coupling to one side of a load is matched by capacitive coupling to the other side of the load. While this approach is successful in minimizing signal distortion, it actually increases the RF interference generated by the amplifier since the number of transistors switching must be increased.

Attempts have been made to minimize the frequency at which the peak amplitude of the RF interference occurs by varying to "dithering" the switching times of the transistors, but doing so tends to increase the distortion of the output signal since a signal input to the amplifier is not sampled at regular intervals. In addition, spread spectrum EMI reduction is limited by audible distortion products at higher deviations. This distortion is normally greater at higher output amplitudes, so it clearly is a distortion since it increases with amplitude.

There is therefore a need for a system and method for operating switching amplifiers in a manner that minimizes the magnitude of RF interference generated by the amplifier, and does so without introducing significant distortion.

SUMMARY

A switching amplifier and method includes first and second output terminals to which a load may be connected. An input signal is applied to switching amplifier. The switching amplifier applies a plurality of periodic first pulses to the first output terminal and it adjusts the widths of the first pulses as a function of the magnitude of the input signal. The switching amplifier also applies a plurality of periodic second pulses to the second output terminal. The second pulses are asynchronous with, but substantially equal in number to, the first pulses. If the input signal has positive and negative polarities, the switching amplifier may obtain positive and negative samples, respectively. In response to the positive samples, the first pulses are periodic and their widths are modulated, and the second pulses have a constant width. In response to the negative samples, the second pulses are periodic and their widths are modulated, and the first pulses have a constant width. The widths of the modulated pulses may be greater than the width of the unmodulated pulses by a magnitude corresponding to the amplitudes of the input signal.

DETAILED DESCRIPTION

Figure 1:
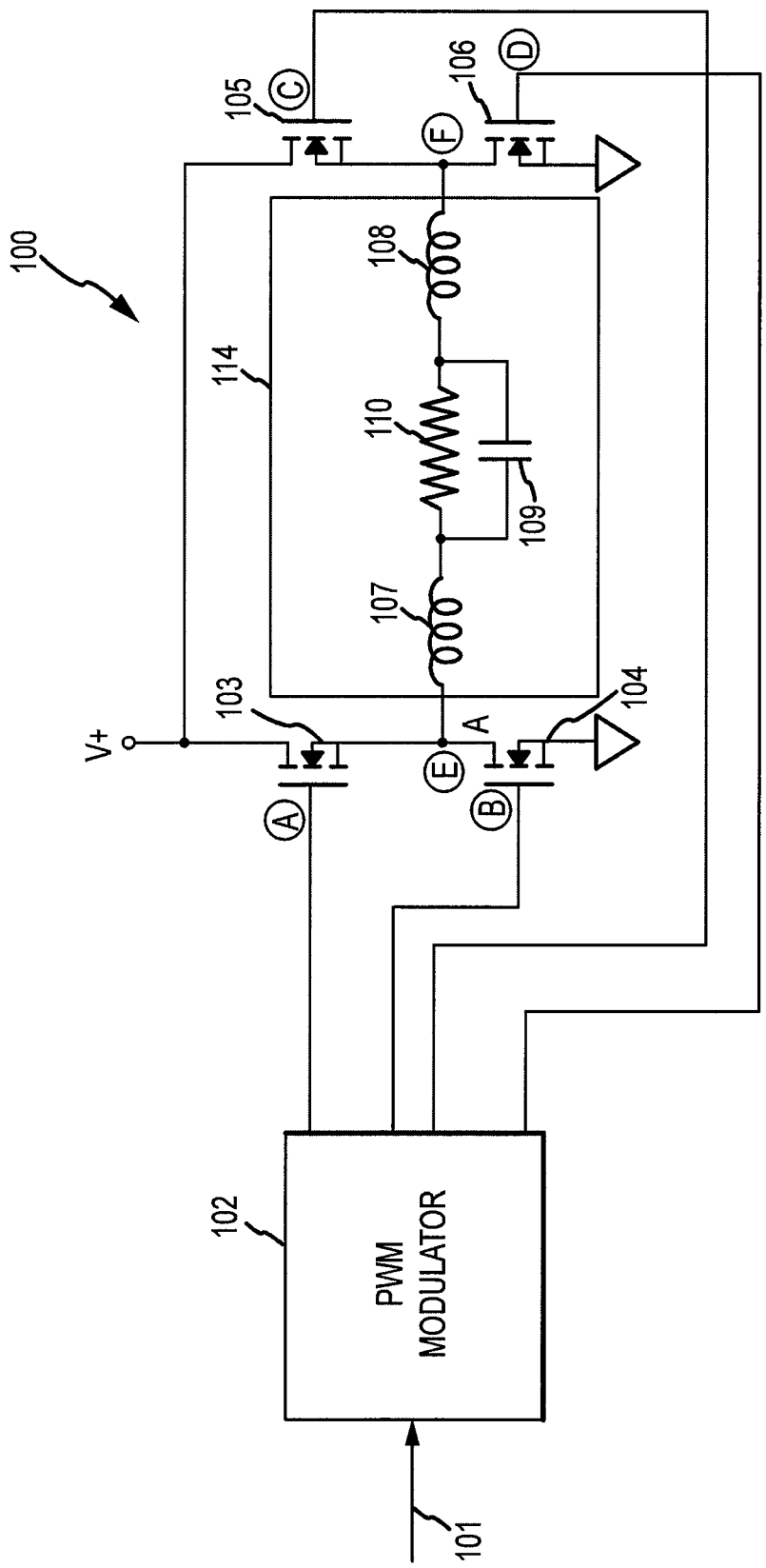
FIG. 1 is a block diagram of a prior art switching amplifier that can be operated according to embodiments of the invention.

A typical prior art switching amplifier 100 is shown in FIG. 1. The switching amplifier 100 includes a pulse-width modulation ("PWM") modulator 102 that receives a signal through an input line 101. The PWM modulator 102 generates four outputs A-D, which drive the gates of respective transistors 103, 104, 105, 106, which are arranged in a bridge or H configuration. The transistors 103, 104 are connected in series between a supply voltage V+ and ground, and the transistors 105, 106 are similarly connected in series between V+ and ground. A load 114 is connected between a first output node E formed by the junction between the transistors 103, 104 and a second output node F formed by the junction between the transistors 105, 106.

As shown in FIG. 1, the load 114 is formed by a resistive load 110 connected in parallel with a capacitor 109, both of which are connected between a pair of inductors 107, 108. As is well known in the art, the inductors 107, 108 and capacitor 109 form an LC filter that reduces the amount of electromagnetic energy generated by switching the transistors 103-106 ON and OFF. Although FIG. 1 shows the load 114 formed by a resistive load 110 and LC filter, the load 114 may instead be inductive, such as a MRI coil, capacitive, such as a piezoelectric acoustic transducer, or some combination on these impedance elements. Also, although transistors 103-106 are shown as being the devices used to switch various voltages to the load 114 at various times, it will be understood that other switching devices may be used. Finally, configurations of switching devices other than that shown in FIG. 1 may also be used to apply various voltages to the load 114 at various times.

Figure 2:
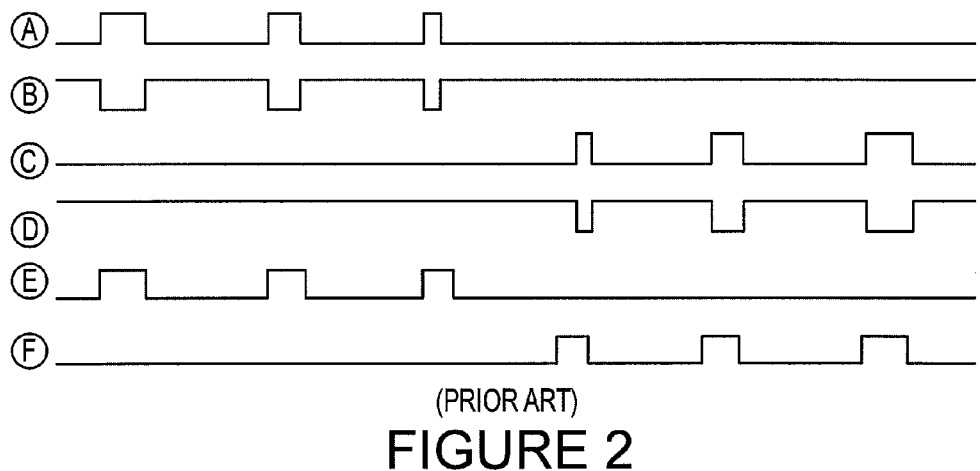
FIG. 2 is a timing diagram showing an example of how the switching amplifier of FIG. 1 has been operated in the prior art.

The operation of the amplifier 100 is shown in FIG. 2 in which six waveforms A-F have been labeled to show an example of the signals present at the corresponding nodes A-F when operating the amplifier 100 in a conventional manner. The signal A is initially driven high to turn ON the transistor 103 for a period corresponding to the amplitude of the signal applied to the PWM modulator 102. At the same time and for the same period, the signal B is driven low to turn OFF the transistor 104. The transistor 106 is ON during this time. As a result, the voltage V+ is connected to ground through the inductor 108, resistive load 110 and inductor 107, thereby causing current to start flowing through the resistive load 110. Were it not for the filter formed by the inductors 107, 108 and capacitor 109, the sudden increase in current through the transistors 103, 106 resulting from turning the transistor 103 ON would result in substantial RF interference. However, this RF interference is attenuated to some extent by the filter formed by the inductors 107, 108 and capacitor 109.

At the end of the period corresponding to the amplitude of the signal applied to the PWM modulator 102, the signal A transitions low to turn OFF the transistor 103, and the signal B transitions high to turn ON the transistor 104. Again, if the inductors 107, 108 and capacitor 109 were not present, substantial RF interference might be generated by switching the transistor 103 OFF.

A predetermined period later, the above sequence is repeated except that the transistor 103 is turned ON and the transistor 104 is turned OFF for a period that is shorter than the period that the transistor 103 was previously turned ON because the amplitude of the signal applied to PWM modulator 102 is lower. As a result, a current flows through the resistive load 110 for a shorter period. The above sequence is then repeated again for an even shorter period corresponding to the lower amplitude of the signal applied to the PWM modulator 102.

Next, the polarity of the signal applied to the resistive load 110 is reversed by repeating the above sequence except that the transistor 105 is turned ON instead of the transistor 103, and the transistor 106 is turned OFF instead of the transistor 104. Thus, when the input signal to the PWM modulator 102 is positive, the pulse width of the signals applied to the transistors 103, 104 are modulated, and when the input signal to the PWM modulator 102 is negative, the pulse width of the signals applied to the transistors 105, 106 are modulated.

The switching amplifier 100 operating as described above provides adequate performance in may cases, but it results in distortion that can be excessive when low distortion amplification is required. The reason for this distortion is essentially the capacitive coupling between the gates of the transistors 103-106 and the nodes E, F, which effectively distorts the width of the pulses generated at the nodes E, F. When this capacitive coupling occurs, the width of these pulses no longer correspond to the amplitude of the signal applied to the PWM modulator 102.

Figure 3:
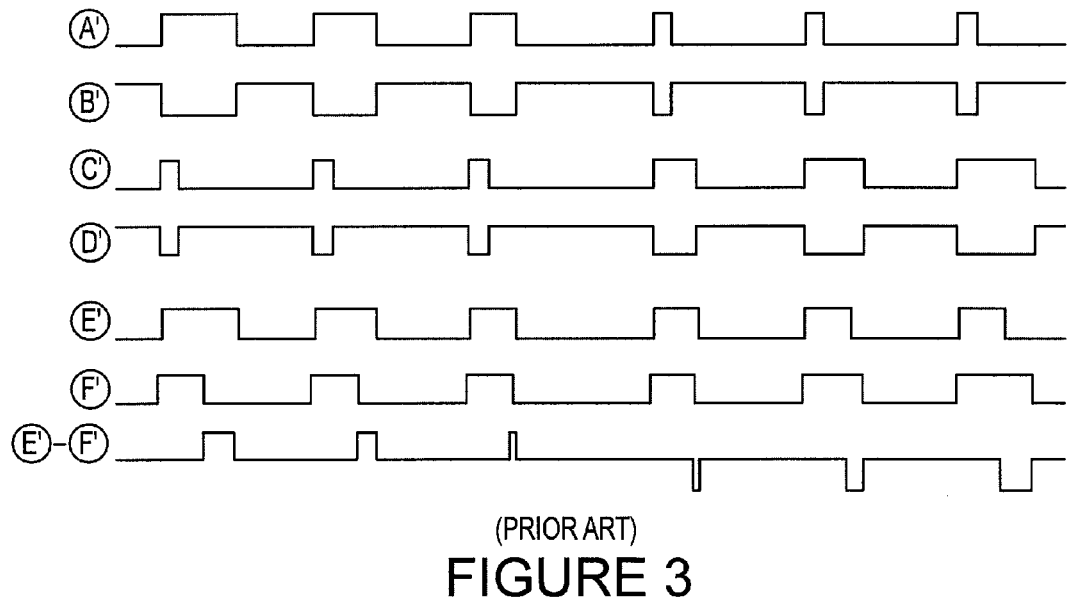
FIG. 3 is a timing diagram showing an example of how the switching amplifier of FIG. 1 has been operated in the prior art in an attempt to minimize output signal distortion.

One approach to reducing the distortion of the amplifier 100 operating as described above is to operate the amplifier 100 as shown in FIG. 3 in which the same signal is applied to the PWM modulator 102 as in the example shown in FIG. 2. As shown in FIG. 3, when the input signal to the PWM modulator 102 is positive, the pulse width of the signals applied to the transistors 103, 104 are still modulated, and when the input signal to the PWM modulator 102 is negative, the pulse width of the signals applied to the transistors 105, 106 are still modulated. However, when applying pulsewidth modulated signals to a first side of the load 114, unmodulated signals are applied to the first side of the load as well as second side of the load 114. Applying unmodulated signals to both sides of the load, mitigates differential charge injection. The transistors 103, 104 are switched ON and OFF respectively for a period that is constant when the input signal to the PWM modulator 102 is positive, and the transistors 105, 106 are switched ON and OFF, respectively, for a period that is constant when the input signal to the PWM modulator 102 is negative. When both transistors 103, 105 are turned ON, the effect is as if neither transistor 103, 105 was turned ON. However, the capacitive coupling from the gate of the transistor 103 to the node E is matched by the capacitive coupling from the gate of the transistor 105 to the node F. The periods during which the transistor 103 is turned ON while the transistor 105 is OFF are identical to the periods during which the transistor 103 is turned ON in the example of FIG. 2, as can be seen by the signal E'-F'. As a result, the currents through the resistive load when operating as in FIG. 3 are the same and of the same duration as when operating as shown in FIG. 2. Moreover, the capacitive coupling of the signal A to the node E occurs the same number of times that the signal C is capacitively coupled to the node F. Similarly, the capacitive coupling of the signal B to the node E occurs the same number of times that the signal D is capacitively coupled to the node F. As a result, the capacitive coupling to the node E cancels out the capacitive coupling to the node F, thereby preserving the width of the pulses generated at the nodes E, F. Therefore, operating the amplifier 100 as shown in FIG. 3 results in very little distortion.

An additional problem with operating the amplifier 100 as shown in FIG. 2 is the electromagnetic RF interference resulting from switching the transistors 103-108 as explained therein. Operating the amplifier 100 as shown in FIG. 3 does not solve this problem. To the contrary, operating the amplifier 100 as shown in FIG. 3 can actually exacerbate the problem of RF interference because both transistors 103, 105 switch at the same time compared to the operation as shown in FIG. 2 in which only one of the transistors, 103 or 105, switch. Similarly, in FIG. 3, both transistors 104, 106 switch at the same time. Since RF interference is generated each time one of the transistors 103-106 is switched, doubling the number of transistors being switched increases the magnitude of the RF interference.

Figure 4:
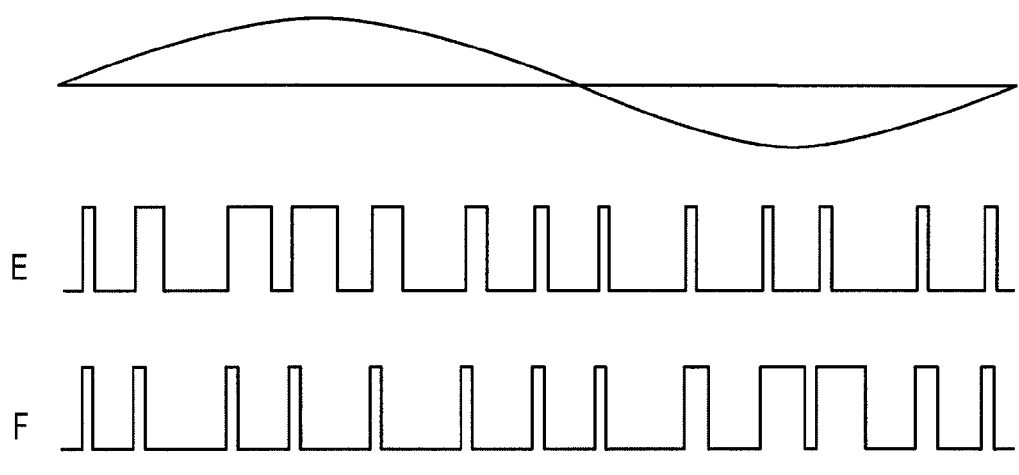
FIG. 4 is a timing diagram showing an example of how the switching amplifier of FIG. 1 has been operated in the prior art in an attempt to minimize electromagnetic RF interference.

One approach to reducing the magnitude of the RF interference is to vary or "dither" the timing (but not the duration) at which the transistors 103, 105 are turned ON as shown in FIG. 4 in which the signal applied to the PWM modulator 102 is shown in the top line, the signal at the node E is shown in the next line, and the signal at the node F is shown in the bottom line. As shown therein, the operation of the circuit is similar to the operation shown in FIG. 3. The unmodulated pulses again have a constant width, and they again are provided to compensate for the capacitive coupling through the transistors 103, 105 receiving the pulse-width modulated signals from the PWM modulator 102. The operation of the switching amplifier 100 shown in FIG. 4 differs from the operation shown in FIG. 3 in that the time between switching the transistors 103, 105 is not constant. Instead, for example, the duration of the period between the transistor 103 first being turned ON and the transistor 103 being turned ON a second time is different from the period between with transistor 103 being turned ON a second time and then turning ON a third time. By varying the conductive times of the transistors 103-106 in this manner, the frequency at which the peak amplitude of the RF interference spectrum occurs is varied from pulse-to-pulse, thereby distributing the RF interference over a range of frequencies. In contrast, the frequency at which the peak amplitude of the RF interference spectrum occurs when operating as shown in FIG. 3 is the same from pulse-to-pulse. As a result, the peak amplitude of the RF interference at output sample rate is significantly higher when operating the amplifier 100 as shown in FIG. 3 compared to operating as shown in FIG. 4.

Although operating the amplifier 100 as shown in FIG. 4 significantly reduces the magnitude of the RF interference, the amplifier 100 can nevertheless generate RF interference that can be excessive in some instances. Additionally, operating the amplifier 100 as shown in FIG. 4 can produce excessive distortion because the signal applied to the PWM modulator 102 is not sampled at a constant rate. The technique disclosed in this embodiment causes low level constant distortion, such as tape hiss, which is not perceived to be distortion by most listeners. Dithering can therefore be pushed higher (reducing measured EMI) before encountering customer complaints.

Figure 5:
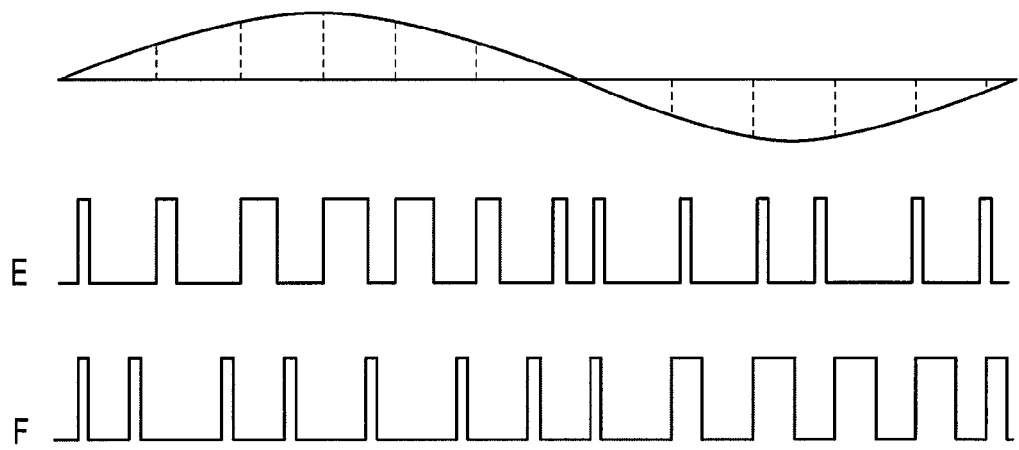
FIG. 5 is a timing diagram showing the operation of the switching amplifier of FIG. 1 according to one embodiment of the invention.

According to one embodiment of the invention, the switching amplifier is operated as shown in FIG. 5. The signal applied to the PWM modulator 102 is again shown in the top line, the signal at the node E is shown in the next line, and the signal at the node F is shown in the bottom line. When the input signal is positive, the width of the pulses at node E are again modulated, and when the input signal is negative, the width of the pulses at node F are again modulated. The unmodulated pulses continue to have a constant width, and they again are provided to compensate for the capacitive coupling through the transistors 103, 105 receiving the pulse-width modulated signals from the PWM modulator 102.

The operation of the switching amplifier 100 according to one embodiment of the invention as shown in FIG. 5 differs from the operation shown in FIG. 4 by varying or "dithering" the times between only the unmodulated pulses. The times between the PWM modulated pulses are constant. As a result, the sampling times of the input signal can be constant, thus avoiding distortion in the output signal from the amplifier 100. Yet, by varying or "dithering" the switching times of the unmodulated pulses used to compensate for the capacitive coupling of the modulated pulses, the frequency of the peak amplitude of the RF interference is varied, thus minimizing the peak amplitude of the RF interference. Operating the amplifier 100 as shown in FIG. 5 thus produces relatively little RF interference in a manner that does not result in output signal distortion. The dithering of the unmodulated pulse switching times may vary in a pseudo-random manner.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of operating a switching amplifier having an input terminal and a pair of first and second output terminals, the method comprising:
    applying an input signal to the input terminal during a first period of time;
    sampling the input signal at a constant rate during the first period of time to generate a plurality of first pulses and applying the plurality of first pulses to the first output terminal during the first period of time;
    applying a plurality of second pulses to the second output terminal during the first period of time, wherein the number of second pulses are substantially equal to the number of first pulses;
    dithering the plurality of second pulses such that a rate of the second pulses is different than the constant rate during at least a portion of the first period of time; and
    pulse-width modulating the first pulses during the first period of time so that the widths of the first pulses are determined by the input signal.

2. The method of claim 1 wherein the input signal alternates between positive and negative values, and wherein the first period of time comprises a period of time when the input signal is positive, wherein the method further comprises:
    applying an input signal to the input terminal during a second period of time occurring when the input signal is negative;
    applying a plurality of third pulses to the second output terminal during the second period of time;
    applying a plurality of fourth pulses to the first output terminal during the second period of time, wherein the number of fourth pulses are substantially equal to the number of third pulses, and wherein the intervals between the fourth pulses are different from the intervals between the third pulses; and
    pulse-width modulating the third pulses during the second period of time so that the widths of the third pulses are determined by the input signal.

3. The method of claim 1, wherein said pulse-width modulating the first pulses comprises pulse-width modulating the first pulses so that the widths of the first pulses are greater than the widths of the second pulses by a value that is determined by the input signal.

4. A method of operating a switching amplifier having an input terminal and a pair of first and second output terminals, the method comprising:
    applying an input signal to the input terminal during a first period of time;
    applying a plurality of first pulses to the first output terminal during the first period of time;
    applying a plurality of second pulses to the second output terminal during the first period of time, wherein the number of second pulses are substantially equal to the number of first pulses;
    varying the intervals between the second pulses in a pseudo-random manner such that the intervals between the second pulses are different from the intervals between the first pulses; and
    pulse-width modulating the first pulses during the first period of time so that the widths of the first pulses are determined by the input signal.

5. The method of claim 4, wherein said varying the intervals comprises varying the intervals in the second pulses according to a predetermined algorithm.

6. A method of operating a switching amplifier having an input terminal and a pair of first and second output terminals, the method comprising:
    applying an input signal to the input terminal during a first period of time;
    applying a plurality of first pulses to the first output terminal during the first period of time;
    applying a plurality of second pulses to the second output terminal during the first period of time, wherein the number of second pulses are substantially equal to the number of first pulses;
    varying the intervals of the second pulses in a non-periodic manner such that the intervals between the second pulses are different from the intervals between the first pulses; and
    pulse-width modulating the first pulses during the first period of time so that the widths of the first pulses are determined by the input signal.

7. A method of applying a signal to a load having first and second terminals, the method comprising:
applying a plurality of periodic first pulses to the first terminal;
adjusting the widths of the first pulses as a function of the magnitude of an input signal; and
applying a plurality of second pulses to the second terminal, wherein the second pulses are asynchronous with, but substantially equal in number to, the first pulses.

8. The method of claim 7, further comprising filtering the first and second pulses applied to the load to attenuate the frequencies of the first and second pulses.

9. The method of claim 7, wherein the widths of the first pulses are adjusted only when the input signal has a positive polarity.

10. The method of claim 7, wherein the intervals between the second pulses vary in a pseudo-random manner.

11. The method of claim 7, wherein said adjusting the widths of the first pulses comprises adjusting the widths of each of the first pulses so that they are greater than the widths of corresponding ones of the second pulses by respective amounts that are determined by the magnitude of the input signal.

12. The method of claim 7, wherein the load comprises a resistive load.

13. A method of applying a signal to a load having first and second terminals, the method comprising:
sampling an input signal having positive and negative values to provide a plurality of positive and negative samples, respectively;
in response to each of the positive samples, applying to the first terminal a pulse having a width that is a function of the magnitude of the respective positive sample, wherein the pulses applied to the first terminal in response to the positive samples occur at regular intervals;
in response to each of the positive samples, applying to the second terminal a pulse having a constant width, wherein the pulses applied to the second terminal in response to the positive samples occurring at irregular intervals;
in response to each of the negative samples, applying to the second terminal a pulse having a width that is a function of the magnitude of the respective negative sample, wherein the pulses applied to the second terminal in response to the negative samples occurring at regular intervals; and
in response to each of the negative samples, applying to the first terminal a pulse having a constant width, wherein the pulses applied to the first terminal in response to the negative samples occurring at irregular intervals.

14. The method of claim 13 wherein said applying to the first terminal a pulse of the load in response to each of the positive samples comprises applying to the first terminal a pulse having a width that is greater than the width of the pulses applied to the second terminal in response to the positive samples by a magnitude corresponding to the magnitude of the respective positive sample, and wherein said applying to the second terminal a pulse in response to each of the negative samples comprises applying to the second terminal a pulse having a width that is greater than the width of the pulses applied to the first terminal in response to the negative samples by a magnitude corresponding to the magnitude of the respective negative sample.

15. The method of claim 13, further comprising attenuating relatively high frequency components of the pulses applied to the first and second terminals.

16. A method of applying a signal to a load having first and second terminals, the method comprising:
sampling an input signal having positive and negative values to provide a plurality of positive and negative samples, respectively;
in response to each of the positive samples, applying to the first terminal a pulse having a width that is a function of the magnitude of the respective positive sample, wherein the pulses applied to the first terminal in response to the positive samples occur at regular intervals;
in response to each of the positive samples, applying to the second terminal a pulse having a constant width, wherein the pulses applied to the second terminal in response to the positive samples occur at random intervals;
in response to each of the negative samples, applying to the second terminal a pulse having a width that is a function of the magnitude of the respective negative sample, wherein the pulses applied to the second terminal in response to the negative samples occur at regular intervals; and
in response to each of the negative samples, applying to the first terminal a pulse having a constant width, wherein the pulses applied to the first terminal in response to the negative samples occur at random intervals.

\* \* \* \* \*